United States Patent [19]

Muraoka

[11] Patent Number: 5,402,010
[45] Date of Patent: Mar. 28, 1995

[54] SEMICONDUCTOR DEVICE INCLUDING INTERNAL CIRCUIT HAVING BOTH STATES OF ACTIVE/PRECHARGE

[75] Inventor: Kazuyoshi Muraoka, Yokohama, Japan

[73] Assignee: Kabushiki Kaisha Toshiba, Kawasaki, Japan

[21] Appl. No.: 56,408

[22] Filed: May 4, 1993

[30] Foreign Application Priority Data

May 7, 1992 [JP] Japan .................. 4-114406

[51] Int. Cl.$^6$ .................................. G11C 11/34
[52] U.S. Cl. .................. 327/198; 365/189.05; 327/51; 327/545
[58] Field of Search ........... 307/272.3, 296.4, 296.5, 307/272.2, 291, 530; 365/189.01, 189.05, 189.08

[56] References Cited

U.S. PATENT DOCUMENTS

| 4,386,281 | 5/1983 | Terry | 307/272.3 |
| 4,918,663 | 4/1990 | Remington et al. | 307/272.3 |
| 5,153,452 | 10/1992 | Iwamura et al. | 307/296.4 |
| 5,159,206 | 10/1992 | Tsay et al. | 307/272.3 |
| 5,278,460 | 1/1994 | Casper | 307/296.5 |

FOREIGN PATENT DOCUMENTS 60-69895  4/1985  Japan .

Primary Examiner—Timothy P. Callahan
Assistant Examiner—My-Trang Nu Ton
Attorney, Agent, or Firm—Foley & Lardner

[57] ABSTRACT

A semiconductor device has a plurality of internal circuits capable of having two conditions of an active state and a precharge state in the internal circuits. The device comprises signal generation element for generating a first signal which causes said internal circuits to be initialized until satisfying a predetermined condition from a time when the power is supplied; and state set element which is connected to an external apparatus through an interface which is supplied an external state signal, and for setting a precharge state of the internal circuits by outputting an internal state signal corresponding to the external state signal in response to a supply of the first signal from the signal generation element.

6 Claims, 9 Drawing Sheets

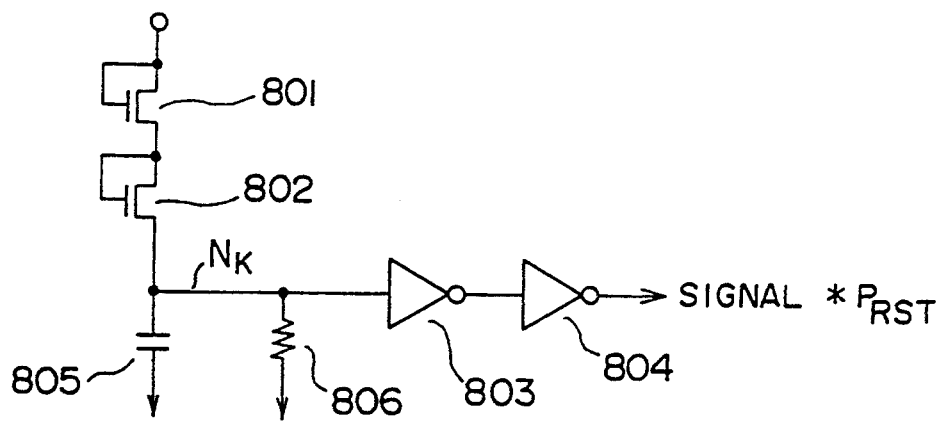
F I G. 13
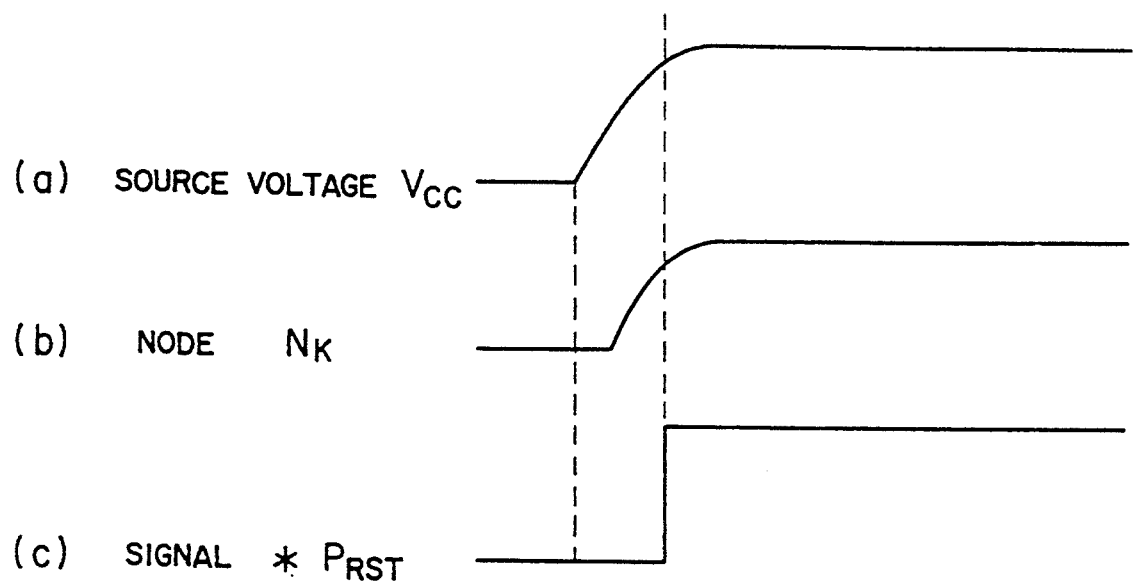
F I G. 14

5,402,010

SEMICONDUCTOR DEVICE INCLUDING INTERNAL CIRCUIT HAVING BOTH STATES OF ACTIVE/PRECHARGE

BACKGROUND OF THE INVENTION

The present invention relates to a semiconductor device, particularly to, a semiconductor device such as a read only memory (ROM), a random access memory having dynamic circuits (DRAM) and the like, in which internal circuits have both states of active/precharge.

A semiconductor device generally has a circuitry in which an external signal state can be transmitted into internal circuits thereof even in cases when and after a power source is turned on. In both cases, it is too difficult to initialize inside of the semiconductor device such as internal flipflop circuits and the other internal nodes by both states of active/precharge of external signals when the power is turned on. Actually, since it is incorrect to initialize the flipflops and internal nodes by input level of the external signals in the semiconductor device when the power is turned on, each circuit of a plurality of the internal circuit blocks possesses both active/precharge states, thereby resulting an occurrence of an abnormal current or the like. Furthermore, in a nonvolatile semiconductor device which can electrically write data, when users input, at turning on the power, signal levels except allowed external signals at turning on the power, a writing error causes data in the memory to be destroyed.

Accordingly, in the conventional DRAM, several dummy cycles are supplied to the internal flipflops and nodes in the semiconductor device to be initialized. Furthermore, in the nonvolatile semiconductor device enabling an electrical writing such as a flash memory, an input level state is prescribed with respect to the external signals when the power is turned on, in order to prevent the writing error at turning on the power. This is one of the reasons why it is difficult to use the nonvolatile device such as the flash memory.

As described above, in the conventional semiconductor device, it is the problem that the simultaneous condition of the active state and precharge state in each internal circuit causes the semiconductor device to have erroneous operation such as an occurrence of an abnormal current corresponding to the state of the external signal.

SUMMARY OF THE INVENTION

In order to eliminate the above problem, an object of the present invention is to provide a semiconductor device capable of maintaining a normal standby condition when the power is turned on by preventing erroneous operation occurring in internal circuits in accordance with an external signal state at turning on the power.

In order to achieve the above object, the present invention provides a semiconductor device having a plurality of internal circuits capable of having two conditions of an active state and a precharge state in the internal circuits, and the semiconductor device comprises signal generation means for generating a first signal which causes the internal circuit to be initialized until a predetermined condition is satisfied after a predetermined time has elapsed from a time when a power source is supplied; and state set means which is connected to an external apparatus through an interface supplying an external state signal, and for setting a precharge condition of the internal circuits by outputting an internal state signal corresponding to the external state signal in response to a supply of the first signal from the signal generation means.

A first aspect of the present invention is to provide a semiconductor device including signal generation means for generating a first signal at least after a predetermined time passes through from when a power is turned on, and buffer means connected through an interface which inputs an external signal to external apparatus and provided for outputting a predetermined level with no relation to the external signal until the first signal is supplied and for outputting an internal signal corresponding to the external signal after the first signal is received.

Furthermore, a second aspect of the present invention is to provide a semiconductor device including signal generation means for generating a first signal at least after a predetermined time passes through from when a power is turned on, and buffer means connected through an interface which inputs an external signal to external apparatus and provided for outputting a predetermined level with no relation to the external signal until the first signal is supplied and for outputting an internal signal corresponding to the external signal after a first rising or trailing of the external signal is detected after receiving the first signal.

Still furthermore, a third aspect of the present invention is to provide a semiconductor device including signal generation means for generating a first signal when a source voltage become over a predetermined voltage, and buffer means connected through an interface which inputs an external signal to external apparatus and provided for outputting a predetermined level with no relation to the external signal until the first signal is supplied and for outputting an internal signal corresponding to the external signal after the first signal is received.

Moreover, a fourth aspect of the present invention is to provide a semiconductor device including signal generation means for generating a first signal when a source voltage becomes greater than a predetermined voltage, and buffer means connected through an interface which inputs an external signal to external apparatus and provided for outputting a predetermined level with no relation to the external signal until the first signal is supplied and for outputting an internal signal corresponding to the external signal after a first rising or trailing of the external signal is detected after receiving the first signal.

By using the means provided by the present invention, the buffer means outputs the predetermined signal to the entire internal circuits with no relation to the external signal before the first signal is supplied from the signal generation means. It is possible to determine an internal state of the internal circuits such as each nodes and the flipflops at turning on the power regardless of the input level of the external signal and only with dependence upon the first signal. Accordingly, it is possible to prevent erroneous operation such as the occurrence of an abnormal current because there is no instantaneous condition of the active state and the precharge state in each of the internal circuits when the power is turned on.

Then the semiconductor device of the present invention is used, it is possible to provide a semiconductor device which does not perform an erroneous operation according to the external signal when the power is turned on.

BRIEF DESCRIPTION OF THE DRAWINGS

In the accompanying drawings:

FIG. 13 is a circuit diagram showing another signal generation means of the present invention;

FIG. 14 is a signal waveform of the circuit showing another signal generation means shown in FIG. 13 of the present invention.

DETAILED DESCRIPTION OF THE PREFERRED EMBODIMENTS

There will be described in detail preferred embodiments with reference to the attached drawings.

At first, there is described a semiconductor device according to a first embodiment of the present invention.

The semiconductor device comprises a timer circuit 201 which is connected to a power source $V_{CC}$ and operates as time limit signal generation means, and a buffer circuit 202. The timer circuit 201 outputs a signal *$P_{RST}$ for functioning a first signal to a node 203 at least after a predetermined time passes through. The buffer circuit 202 outputs an internal signal *R to internal circuits 204 which denotes a state signal corresponding to an external signal *R after the first external signal *R is detected to be rising or trailing after receiving the signal *$P_{RST}$. Namely, the state in the semiconductor circuit becomes an actual use condition, in which the external signal *R is transmitted to the internal signal *R as it is.

Figure 1:
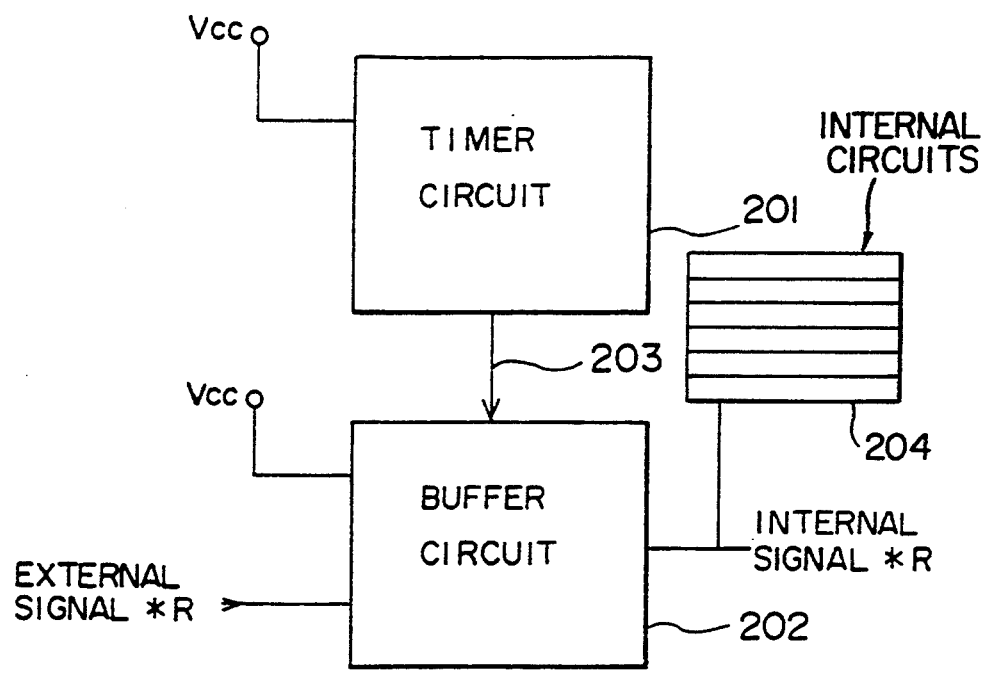
FIG. 1 is a block diagram showing a basic constitution of a semiconductor device according to a first embodiment of the present invention.
Figure 2:
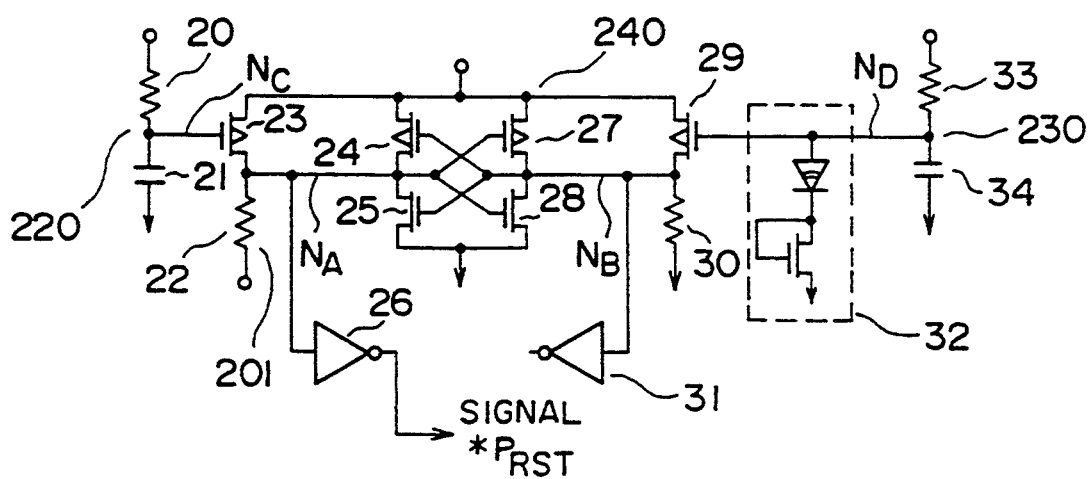
FIG. 2 is a circuit diagram showing a timer circuit used in the semiconductor device according to the first embodiment of the present invention.

A circuitry of the timer circuit 201 is shown in FIG. 2. The circuit comprises an RC filter 220 which is comprised of a resistor element 20 and a capacitor element 21 which are connected in series between the power source $V_{CC}$ and a grounded potential, a P-channel metal oxide semiconductor (MOS) transistor 23 in which its gate is connected to the RC filter 220, its source is connected through the resistor element 23 to the power source $V_{CC}$, and its drain is connected to the power source $v_{CC}$, an RC filter 230 which is comprised of a resistor element 33 and a capacitor element 34 which are connected in series between the power source $V_{CC}$ and a grounded potential, a clamp circuit 32 for clamping an output of the RC filter 230 at a predetermined potential, a P-channel MOS transistor 29 in which its gate is connected to the RC filter 230, its source is connected through a resistor element 30 to the grounded potential, and its drain is connected to the power source $V_{CC}$, a flipflop circuit 240 which is comprised of p-channel MOS transistors 24 and 27 and N-channel MOS transistors 25 and 28 and uses as double terminals sources of the MOS transistors 23 and 29, an inverter circuit 26 for outputting *$P_{RST}$ after inverting one terminal at the side of the MOS transistor 23 of the flipflop circuit 240, and an inverter circuit 31 for inverting the other terminal at the side of the MOS transistor 29 of the flipflop circuit 240. Here, both of the resistors 22 and 30 are a high resistor element, and the clamp circuit 32 is comprised of a diode and a MOS transistor to clamp a node $N_D$ by a predetermined potential. The MOS transistors 23 and 29 have the same potential, and the inverter 31 and inverter 26 are provided for balancing the load. In such a constitution, the timer circuit 201 has a balance at the both sides of the flipflop 240.

Next, an operation is described with respect to the timer circuit shown is FIG. 2. At first, there is described a case when the power voltage is sharply rising up. At an initial time of turning on the power source, a node $N_A$ is set to a power potential through the resistor element 22, and a node $N_B$ is set to a ground potential through the resistor element 30, respectively. As a result, the flipflop 240 is set (namely, the node $N_A$ is "H"). Accordingly, the signal *$P_{RST}$ is initialized to "L" through the inverter 26. After some time (for example, 1 μsec) passes, a node $N_D$ is clamped to a predetermined potential by the clamp circuit 32. Accordingly, the current driving capability of the MOS transistor 29 becomes higher than that of the MOS transistor 23, so that the potential of the node $N_B$ becomes higher than that of the node $N_A$. Therefore, the flipflop 240 is inverted to cause the potential of the node $N_A$ to be "L". Accordingly, the signal *$P_{RST}$ becomes "H" through the inverter 26.

The following is the description in the case where the power source voltage is slowly rising up. At an initial time of turning on the power source, node $N_A$ is set to a power potential (namely, it is not rising sufficiently) through the resistor element 22, and node $N_B$ is set to a ground potential through the resistor element 30, respectively. As a result, the flipflop 240 is set (namely, the node $N_A$ is "H"). Accordingly, the signal *$P_{RST}$ is initialized to "L" through the inverter 26. The nodes $N_C$ and $N_D$ as outputs of the RC filters 220 and 230 are rising in accordance with an increase of the power source voltage, and the node $N_D$ is clamped to a predetermined potential by the clamp circuit 32. Accordingly, the current driving capability of the MOS transistor 29 becomes higher than that of the MOS transistor 23, so that the potential of node $N_B$ becomes higher than that of node $N_A$. Therefore, the flipflop 240 is inverted to cause the potential of the node $N_A$ to be "L". Accordingly, the signal *$P_{RST}$ becomes "H" through the inverter 26.

In such a manner, the signal *$P_{RST}$ in the timer circuit 201 becomes from "L" to "H" after passing a predetermined time when the power source voltage is rising up sharply, and the signal *$P_{RST}$ becomes from "L" to "H" when the power source reaches a predetermined voltage in the case that the power source is slowly rising up. Namely, after passing at least a predetermined time (in this case, 1 $\mu$sec), the signal *$P_{RST}$ becomes from "L" to "H".

Figure 3:
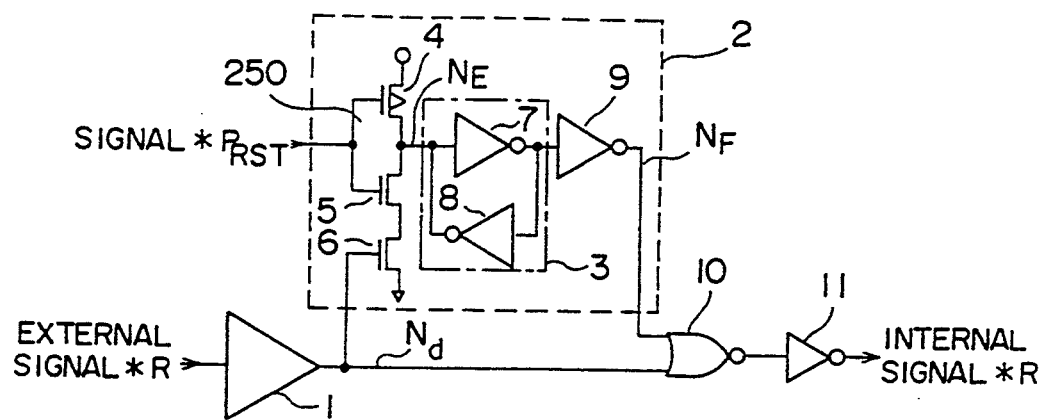
FIG. 3 is a circuit diagram showing a buffer circuit used in the semiconductor device according to the first embodiment of the present invention.

Next, in FIG. 3, there is shown an example of a circuitry of the buffer circuit 202. The circuit comprises a buffer 1 into which an external signal *R is input, an internal signal control circuit 2 for controlling an internal state of each of internal circuit blocks on the basis of an output of the buffer 1 and the signal *$P_{RST}$ as an output of the timer circuit 201, a NOR circuit 10 for calculating a NOR logic between the buffer 1 and the internal signal control circuit 2, and an inverter 11 for inverting an output of the NOR circuit 10. The internal signal control circuit 2 comprises an inverter 250 which is comprised of a P-channel MOS transistor 4 and an N-channel MOS transistor 5 to receive the signal *$P_{RST}$, an N-channel MOS transistor 6 which is provided between the inverter 250 and the ground potential and has a gate connected to the buffer 1, a flipflop 3 which is comprised of inverter 7 and 8 which are connected to an output of the inverter 250, and an inverter 9 which is connected to the flipflop 3.

There will be described an operation of the buffer circuit 202 when connected to the timer circuit 201 with reference to FIGS. 4 and 5.

Figure 4:
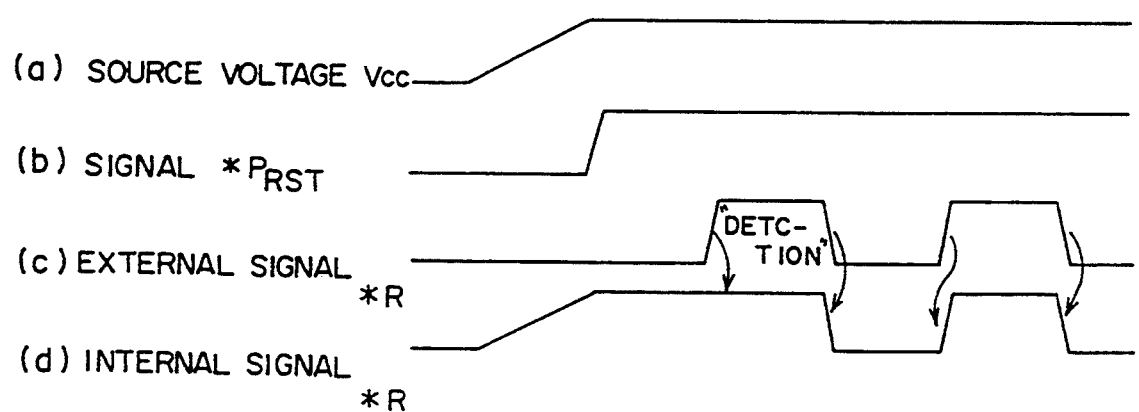
FIG. 4 is a time chart showing operation of the semiconductor device according to the first embodiment of the present invention.
Figure 5:
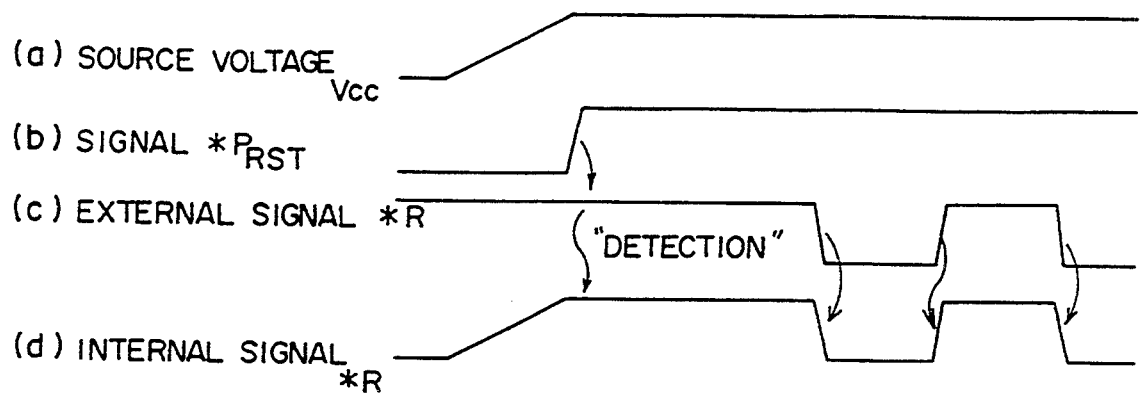
FIG. 5 is a time chart showing another operation of the semiconductor device according to the first embodiment of the present invention.

The following is the operation when the power source is turned on under the condition that the external signal *R is active (namely, "L") in accordance with FIG. 4. When the power is turned on, the signal *$P_{RST}$ continues the "L" state at least before the predetermined time passes through. At this time, a node $N_E$ of an output of the inverter 250 is at a "H" state. The state thereof is latched in the flipflop 3, thereby causing a node $N_F$ to be in a "H" state through the inverter 9. As a result, the internal signal *R becomes the "H" state irrespective of the external signal *R, and at the same time, even though the external signal changes, the internal signal *R maintains to be at the "H" state until at least the predetermined time passes through.

Even when the signal *$P_{RST}$ rises up from "L" to "H" until at least the predetermined time passes through, if the external signal *R is the "L" state, the MOS transistor 8 maintains at the off state and the node $N_E$ does not change from "H" to "L". Namely, since the "H" state is kept, the internal signal *R maintains the "H" state.

Even when the external signal *R rises after the signal *$P_{RST}$ rises, the internal signal *R does not change. Because a "H" level of the external signal *R is transmitted to the NOR gate 10 until the flipflop 3 is inverted even though the node $N_F$ trails from "H" to "L".

Next, when the external signal *R first trails to the "L" immediately after the external signal *R rises to "H" after the signal *$P_{RST}$ rises, the internal signal *R first trails to the "L" because the flipflop 3 has been already inverted and the node $N_F$ has become "L".

Accordingly, the NOR gate 10 outputs "H" to cause the internal signal *R to be "L" After that, since the condition of the flipflop 3 does not change, the level of the external signal *R is transmitted to the internal signal *R as it is, thereby becoming into an actual use condition.

Next, there will be described the operation when the power source is turned on under the condition that the external signal *R is the precharge state (namely, an "H" state) in accordance with FIG. 5. When the power is turned on, the signal *$P_{RST}$ maintains a "L" state until at least the predetermined time passes through, as mentioned above. At this time, the node $N_E$ as the output of the inverter 250 is "H". Accordingly, this condition is latched by the flipflop 3, thereby causing the node $N_F$ to be "H" through the inverter 9. As a result, the internal signal *R becomes "H" irrespective of the external signal *R. At this time, even though the external signal *R changes, the internal signal *R maintains the "H" state until at least the predetermined time passes through.

When the signal *$P_{RST}$ rises up from "L" to "H" at least after the predetermined time passes through, since the external signal *R is "H", the MOS transistor 6 is turned on and the node $N_E$ changes from "H" to "L". However, since the external signal *R is "H", the NOR circuit 10 outputs "L" state signal, thereby resulting the internal signal to be kept to "H".

Next, when the external signal *R first trails to "L" after the signal *$P_{RST}$ first rises, the internal signal *R first trails to "L" because the flipflop 3 has been inverted and the node $N_F$ has been already "L". Accordingly, the NOR gate 10 outputs "H" state signal, thereby resulting in the internal signal *R to be "L" After that, since the condition of the flipflop 3 does not change, the level of the external signal *R is transmitted to the internal signal *R as it is, thereby becoming the actual use condition.

In conclusion, the internal circuits of the semiconductor device are initialized to the precharge state (namely, the internal signal *R is "H") regardless of the state of the external signal *R when the power source is turned on, and the state of the external signal *R is transmitted to the internal circuits when the external signal *R first rises after the predetermined time passes through from the power-on time (the signal *$P_{RST}$ becomes "H"). Therefore, since the initial state of the internal circuits can be set to an arbitrary condition regardless of the external input conditions when the power is on, it is possible to easily initialize each of the flipflops and the nodes. As result, it is possible to prevent an operational error caused by the external signal state when the power is turned on. Of course, it becomes unnecessary to restrict the state of the external signal and the dummy cycles at turning on the power in the manner of the conventional device.

Even though there has been described the example of when the timer circuit 201 is connected to the buffer circuit 202, the present invention may use, in the place of the timer circuit 201, as a signal generation circuit a sensor circuit for sensing that the power source voltage reaches to a predetermined voltage. The example will be described below in reference with FIGS. 13 and 14.

FIG. 13 shows a constitution of the sensor circuit including N-channel MOS transistors 801 and 802 in which gates and sources thereof are connected to each other, a capacitor 805 connected between the MOS transistor 802 and the ground potential, two inverter 803 and 804 connected in series each other and connected to a first connecting point of the transistor 802 and the grounded potential, and a resistor element 806 connected in parallel to a second connection point of the first connecting point. The circuit may not have the capacitor 805.

FIG. 14 shows waveforms of the sensor circuit. Even though the node $N_K$ rises according to the rise of the source voltage $V_{CC}$ at the time $T_1$, the potential of the node $N_K$ cannot exceed the voltage of "$V_{CC}-2V_{TH}$", where $V_{TH}$ is a threshold voltage of the MOS transistors 801 and 802. After a short time, when the voltage of "$V_{CC}-2V_{TH}$" exceeds the threshold voltage of the inverter 803, the signal *$P_{RST}$ rises up. Namely, when the source voltage exceeds a predetermined voltage ("the threshold voltage of the inverter 803"+$2v_{TH}$), the signal *$P_{RST}$ occurs.

Operation of the buffer circuit is eliminated because it is the same as one of the above-mentioned except that "after passing through the predetermined time" are replaced with "after reaching to a predetermined voltage".

In such a manner, the internal circuits of the semiconductor device are initialized to the precharge state (the internal signal *R is "H") regardless of the external signal state when the power is turned on, as stated above. The state of the external signal is transmitted to the internal circuits when the external signal *R first trails after the source voltage reaches the predetermined voltage (when the signal *$_{RST}$ becomes "H"). In this manner, since it is possible to set the initial state of the internal circuits in the semiconductor device to the arbitrary state regardless of the external signal state when the power is supplied, it is easy to initialize each of the flipflops and nodes in the semiconductor device. As a result, the operational error according to the external signal state when the power is supplied can be prevented. Of course, it is unnecessary to restrict the dummy cycle and the external signal state when the power is supplied such as the conventional device.

Figure 6:
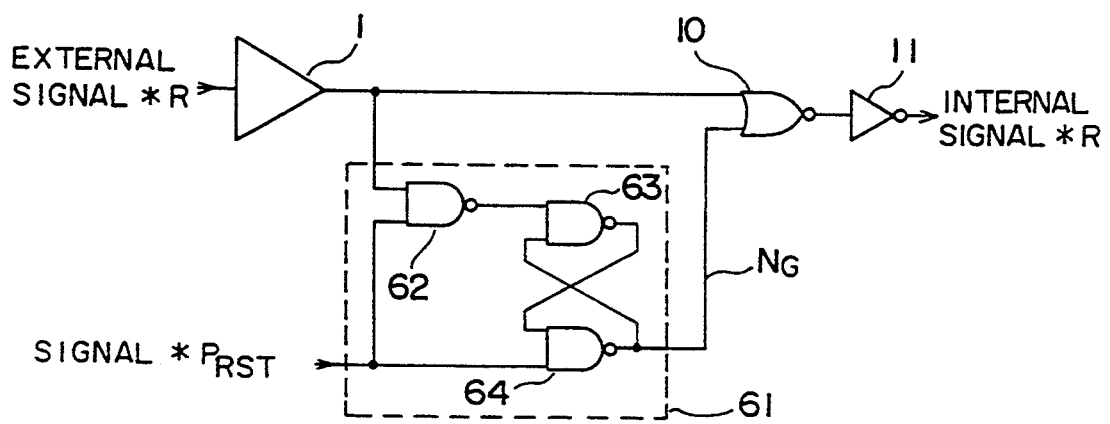
FIG. 6 is a circuit diagram showing a buffer circuit used in the semiconductor device according to a second embodiment of the present invention.

Next, there is shown in FIG. 6 a buffer circuit according to a second embodiment of the present invention. The difference between the first and second embodiments resides in that an internal signal generation circuit 61 is used in the place of the internal signal generation circuit 2, and the circuit 61 is realized as a latch circuit which is comprised of NAND gates 62, 63 and 64. In FIG. 6, the same components as the first embodiment are shown by the same numerals in FIG. 3, and the entire constitution is the same as the first embodiment. The circuit operation will be omitted because it corresponds to the first embodiment. Of course, the signal (*$P_{RST}$) generation circuit is used with the timer circuit 201 and the sense circuit of FIG. 13.

Figure 7:
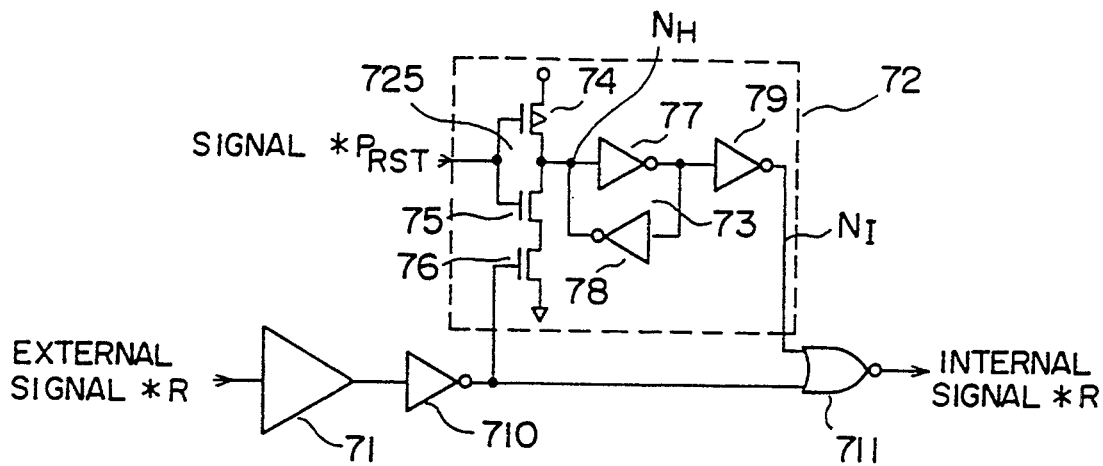
FIG. 7 is a circuit diagram showing a buffer circuit used in the semiconductor device according to a third embodiment of the present invention.

Next, there is shown in FIG. 7 a semiconductor device according to a third embodiment of the present invention. The difference between the first and third embodiments resides in that the internal signal state is set to be active (the internal signal is "L") when the power is supplied. The circuitry comprises a buffer circuit 71 for receiving the external signal *R an inverter 710 for inverting an output of the buffer circuit 71 to output, an internal signal control circuit 72 for controlling an internal state of the internal circuit blocks in the semiconductor device on the basis of an output of the inverter circuit 710 and the signal *$P_{RST}$ as an output of the timer circuit 201, and a NOR circuit 711 for calculating a NOR logic between outputs of the internal signal control circuit 72 and the inverter 710. The internal signal control circuit 72 is comprised of an inverter 725 which includes a P-channel MOS transistor 74 and an N-channel MOS transistor 75 and has an input of the signal *$P_{RST}$, an N-channel MOS transistor 76 which has a gate connected to an output of the inverter 710, a flipflop 73 comprised of inverter 77 and 78 which are connected to an output of the inverter 725, and an inverter 79 connected to the flipflop 73.

Figure 8:
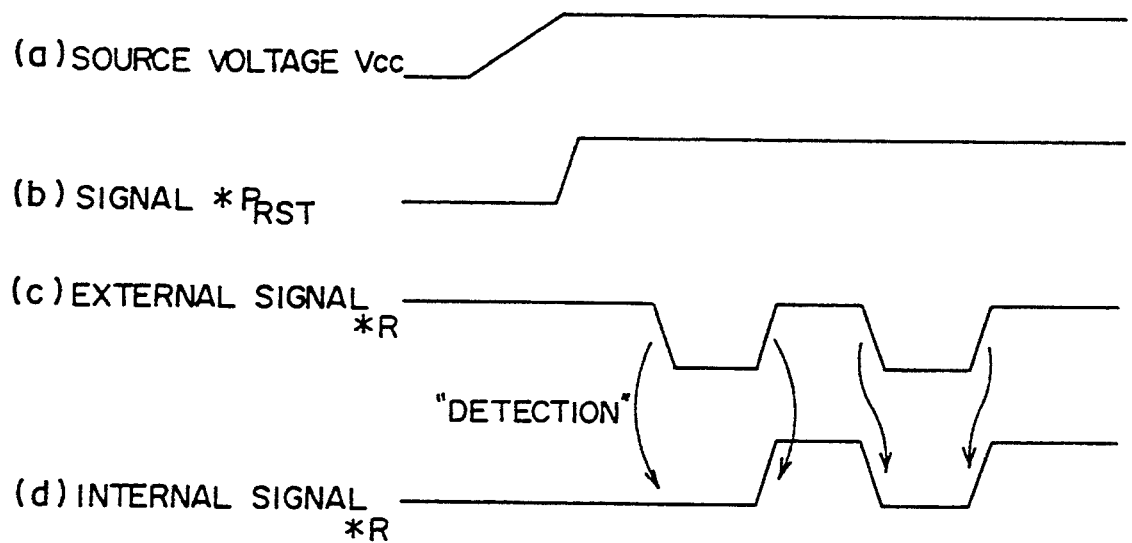
FIG. 8 is a time chart showing operation of the semiconductor device according to the third embodiment of the present invention.
Figure 9:
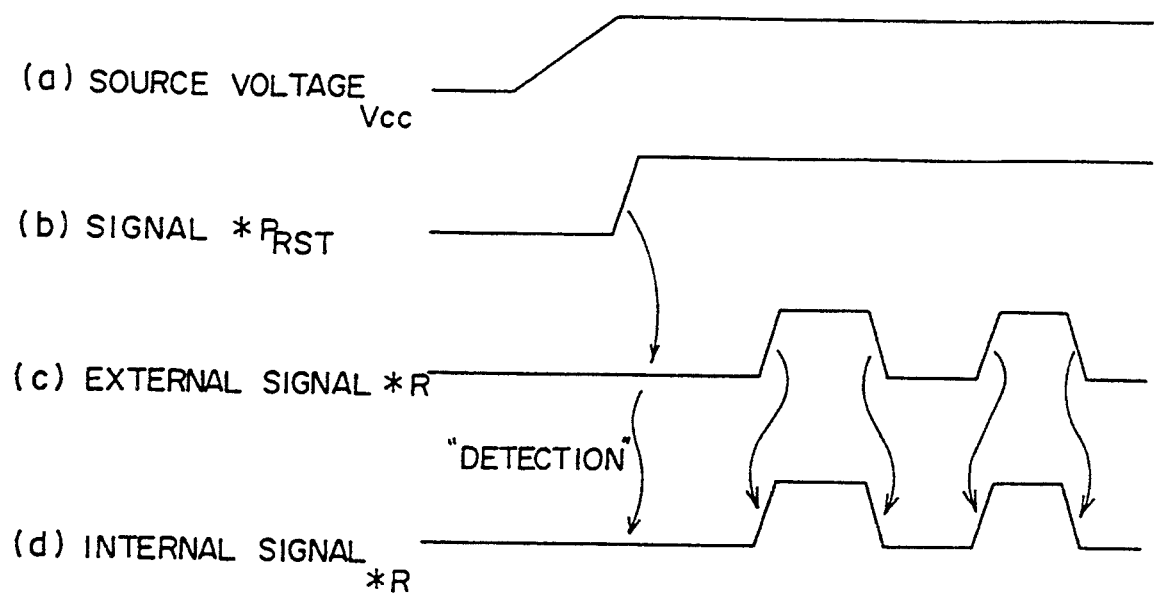
FIG. 9 is a time chart showing another operation of the semiconductor device according to the third embodiment of the present invention.

There is described an operation of the buffer circuit which is connected to the timer circuit 201 in accordance with FIGS. 8 and 9.

At first, there will be described an operation when the power is supplied under the condition that the external signal *R is a precharge state (namely, "H") with reference to FIG. 8. After the power is supplied, the signal *$P_{RST}$ is "L" as described above before passing at least a predetermined time. At this time, a node $N_H$ as an output of the inverter 725 is "H". Accordingly, this state is latched by the flipflop 73, and a node $N_I$ is "H" through the inverter 79. As a result, the internal signal *R is "L" regardless of the external signal *R. At this time, even though the external signal *R changes, the internal signal *R is kept to be "L" until at least the predetermined time passes through.

Next, even though the signal *$P_{RST}$ rises from "L" to "H" after passing at least the predetermined time, as far as the external signal *R is "H", the MOS transistor 76 is in an off state, so that the node $N_H$ does not change from "H" to "L", namely, to keep in the "H" state. As a result, the internal signal *R maintains the "L" state.

Even though the external signal *R trails after the signal *$P_{RST}$ rises, the internal signal *R does not change. Because the level "L" of the external signal *R is transmitted to the NOR gate 711 until that time even though the node $N_I$ trails from "H" to "L" caused by an inversion of the flipflop 73.

Next, when the external signal *R rises first immediately after the external signal *R trails after the signal *$P_{RST}$ rises, the internal signal *R rises first to "H". Because the flipflop 73 has been already inverted and the node $N_I$ has already been "L". Accordingly the NOR gate 711 outputs "H", thereby resulting the internal signal *R to be "H". After that, since the condition of the flipflop 73 does not change, the level of the external signal *R is transmitted to the internal signal *R as it is, and the semiconductor device becomes in the actual use condition.

Next, there will be described an operation when the power is supplied under the condition that the external signal *R is an active state (namely, "L") with reference to FIG. 9. After the power is supplied, the signal *$P_{RST}$ is "L" as described above before passing at least a predetermined time. At this time, a node $N_H$ as an output of the inverter 725 is "H" Accordingly, this state is latched by the flipflop 73, and a node $N_I$ is "H" through the inverter 79. As a result, the internal signal *R is "L" regardless of the external signal *R. At this time, even though the external signal *R changes, the internal signal *R is kept to be "L" until at least the predetermined time passes through.

Next, even though the signal *$P_{RST}$ rises from "L" to "H" after passing at least the predetermined time, since the external signal *R is "L", the MOS transistor 76 is turned on, so that the node $N_H$ changes from "H" to "L". However, since the NOR gate 10 outputs "L", the internal signal *R maintains the "L" state as a result.

Next, when the external signal *R rises first after the signal *P$_{RST}$ rises, the internal signal *R rises first. Because the flipflop 73 has been already inverted and the node N$_I$ has been "L". Accordingly, the NOR gate 711 outputs the level "H", and as a result, the internal signal *R becomes "H". After that, since the state of the flipflop 73 does not change, the level of the external signal *R is transmitted to the internal signal *R as it is, and the semiconductor device becomes in the actual use condition.

Next, when the external signal *R rises first immediately after the external signal *R trails after the signal *P$_{RST}$ rises, the internal signal *R rises first to "H". Because the flipflop 73 has been already inverted and the node N$_I$ has already been "L" Accordingly the NOR gate 711 outputs "H", thereby resulting the internal signal *R to be "H". After that, since the condition of the flipflop 73 does not change, the level of the external signal *R i transmitted to the internal signal *R as it is, and the semiconductor device becomes in the actual use condition.

In conclusion, the internal circuits of the semiconductor device are initialized to the active state (namely, the internal signal *R is "L") regardless of the state of the external signal *R when the power source is turned on, and the state of the external signal *R is transmitted to the internal circuits when the external signal *R first rises after the predetermined time passes through from the power-on time (the signal *P$_{RST}$ becomes "H"). Therefore, since the initial state of the internal circuit can be set to an arbitrary condition regardless of the external input conditions when the power is on, it is possible to easily initialize each of the flipflops and the nodes. As result, it is possible to prevent an operational error caused by the external signal state when the power is turned on. Of course, it becomes unnecessary to restrict the state of the external signal and the dummy cycle at turning on the power in the manner of the conventional device.

Even though there has been described the example of the timer circuit 201 connected to the buffer circuit 202 in the third embodiment, the present invention may use, in the place of the timer circuit 201, as a signal generation circuit a sensor circuit for sensing that the power source voltage reaches to a predetermined voltage a shown in FIG. 13.

Also, in this case, the internal circuits of the semiconductor device are initialized to the active state (namely, the internal signal *R is "L") regardless of the state of the external signal *R when the power source is turned on, and the state of the external signal *R is transmitted to the internal circuits when the external signal *R first rises after the predetermined time passes through from the power-on time (the signal *P$_{RST}$ becomes "H"). Therefore, since the initial state of the internal circuit can be set to an arbitrary condition regardless of the external input conditions when the power is on, it is possible to easily initialize each of the flipflops and the nodes. As result, it is possible to prevent an operational error caused by the external signal state when the power is turned on. Of course, it becomes unnecessary to restrict the state of the external signal and the dummy cycle at turning on the power in the manner of the conventional device.

Figure 10:
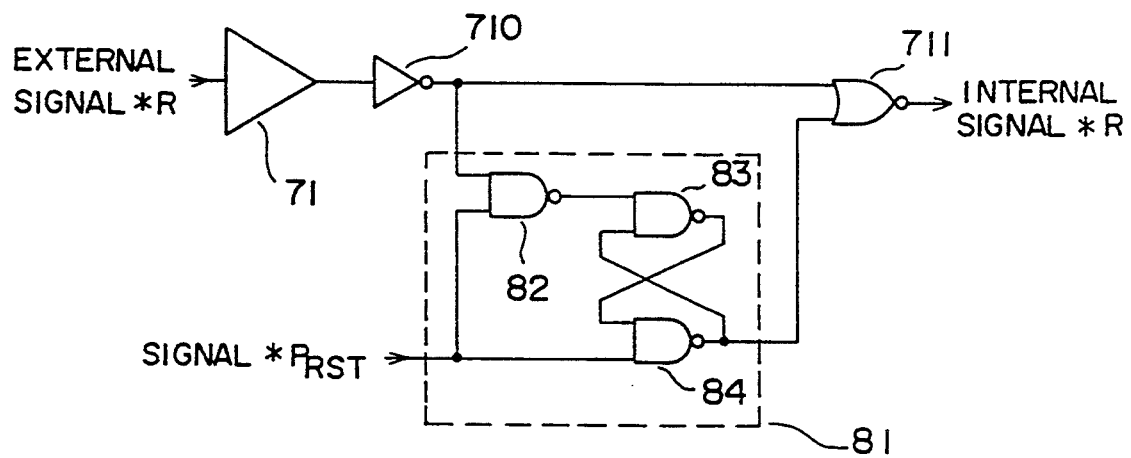
FIG. 10 is a circuit diagram showing a buffer circuit used in a semiconductor device according to a fourth embodiment of the present invention.

Next, FIG. 10 shows a buffer circuit according to a fourth embodiment of the present invention. The difference between the second and fourth embodiments resides in that an internal signal control circuit 81 is used in the place of the internal signal control circuit 72, and the circuit 81 is constituted by a latch circuit which is comprised of NAND gates 82, 83 and 84. The components which are the same as the second embodiment are added with the same numerals as shown in FIG. 7. The circuit operation discussion is eliminated because of similarities to the circuit shown in FIG. 7. Of course, the timer circuit 201 may be used as the signal generation circuit, and the sense circuit or the like shown in FIG. 13 may be used.

Figure 11:
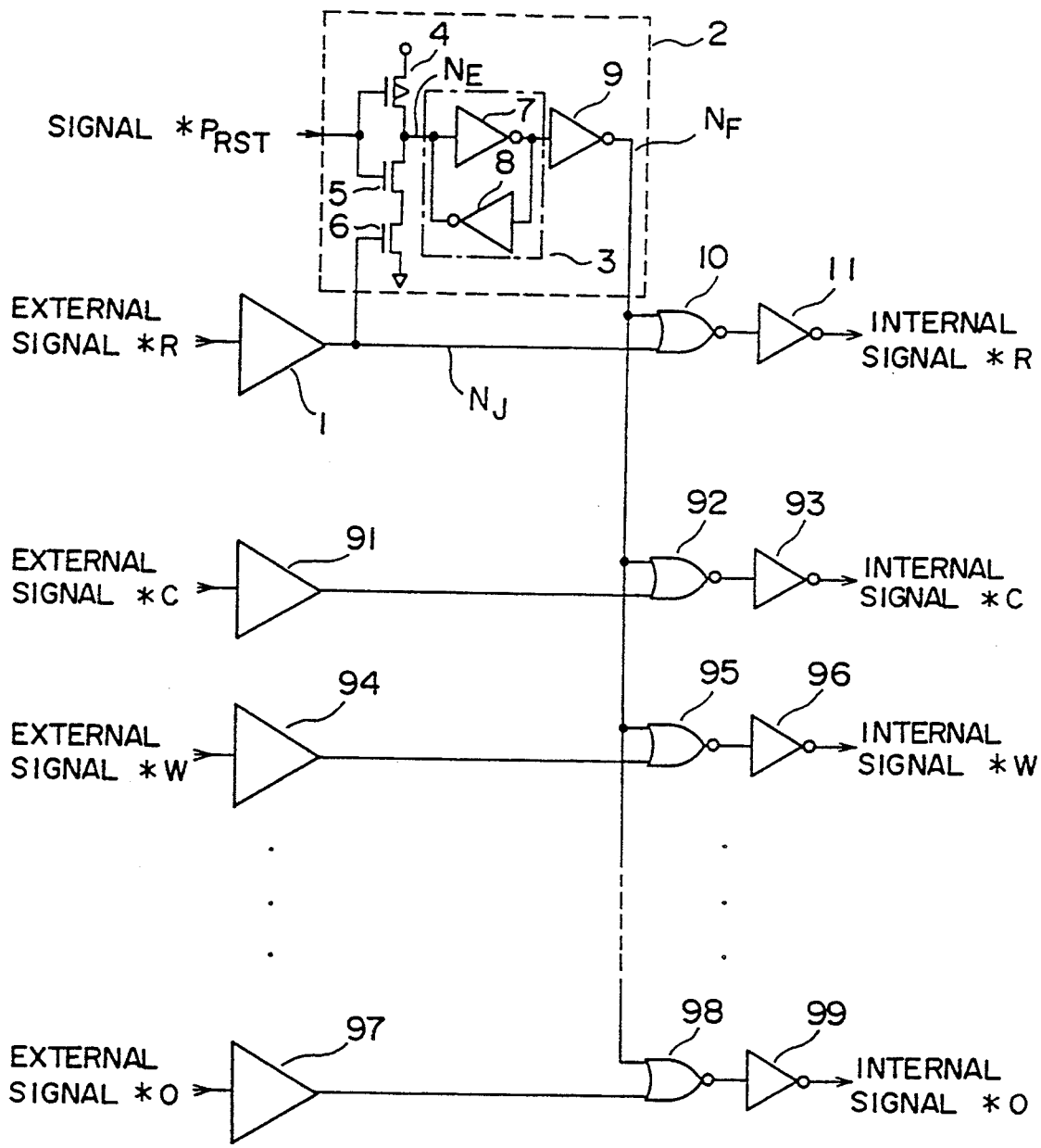
FIG. 11 is a circuit diagram showing a buffer circuit used in a semiconductor device according to a fifth embodiment of the present invention.

Next, there is described a circuit according to a fifth embodiment of the present invention. FIG. 11 shows a circuit diagram of the fifth embodiment by using the circuitry of the first embodiment. The circuit receives external signals *R, *C, *W, ..., *O. For example, when used in a DRAM, the external signal *R is adopted as an internal signal *RAS (row address strobe), *C as *CAS (column address strobe), *W as *WE (write enable), and *O as *OE (output enable), and address terminals are buffering in correspondence with the necessity. Even though the description is applied to an example in which the buffer circuit is connected to the timer circuit 201, it is needless to say that the sense circuit shown in FIG. 13 may generate the signal *P$_{RST}$.

By a constitution shown in FIG. 11, the operation of the first embodiment is performed with respect to an input terminal of a signal for controlling an operation of the semiconductor device. Namely, the internal circuits in semiconductor device are initialized to the precharge (the internal signal *R is "H") state regardless of the external signal state when the power is supplied. The external signal is transmitted to initialize the internal circuits when the external signal *R first trails after the predetermined time passes through (the signal *P$_{RST}$ is "H") when the power is supplied. In such a manner, since the device according to the fifth embodiment can set the initial state of the internal circuits to the arbitrary condition regardless of the external signal state when the power is supplied, it is possible to easily initialize each of the flipflops and the nodes. As a result, it is possible to prevent an erroneous operation caused by the external signal when the power is supplied. Of course, it is unnecessary to restrict the dummy cycle and the external signal state such as the conventional device when the power is supplied. Since the device has commonly the internal signal control circuit, the fifth embodiment of the present invention has a merit that the pattern area decreases on the chip. Furthermore, since only one signal (the external signal *R in this case) can cancel the initial state when the power is supplied and can determine a timing for transmitting the external signal state inside the semiconductor device, it is possible to easily control the internal circuit from the external signal by using the signal generation means and the state setting means as a signal terminal for entering into a certain operational mode (for example, terminal of the signal *RAS in the case of DRAM).

As above-mentioned, even though the fifth embodiment basically uses the circuitry of the first embodiment, the fifth embodiment may use the circuitries shown in the second through fourth embodiments. Furthermore, when the internal circuit blocks has independence, several circuitries of these embodiments may be used together within the extent that there is no erroneous operation.

Figure 12:
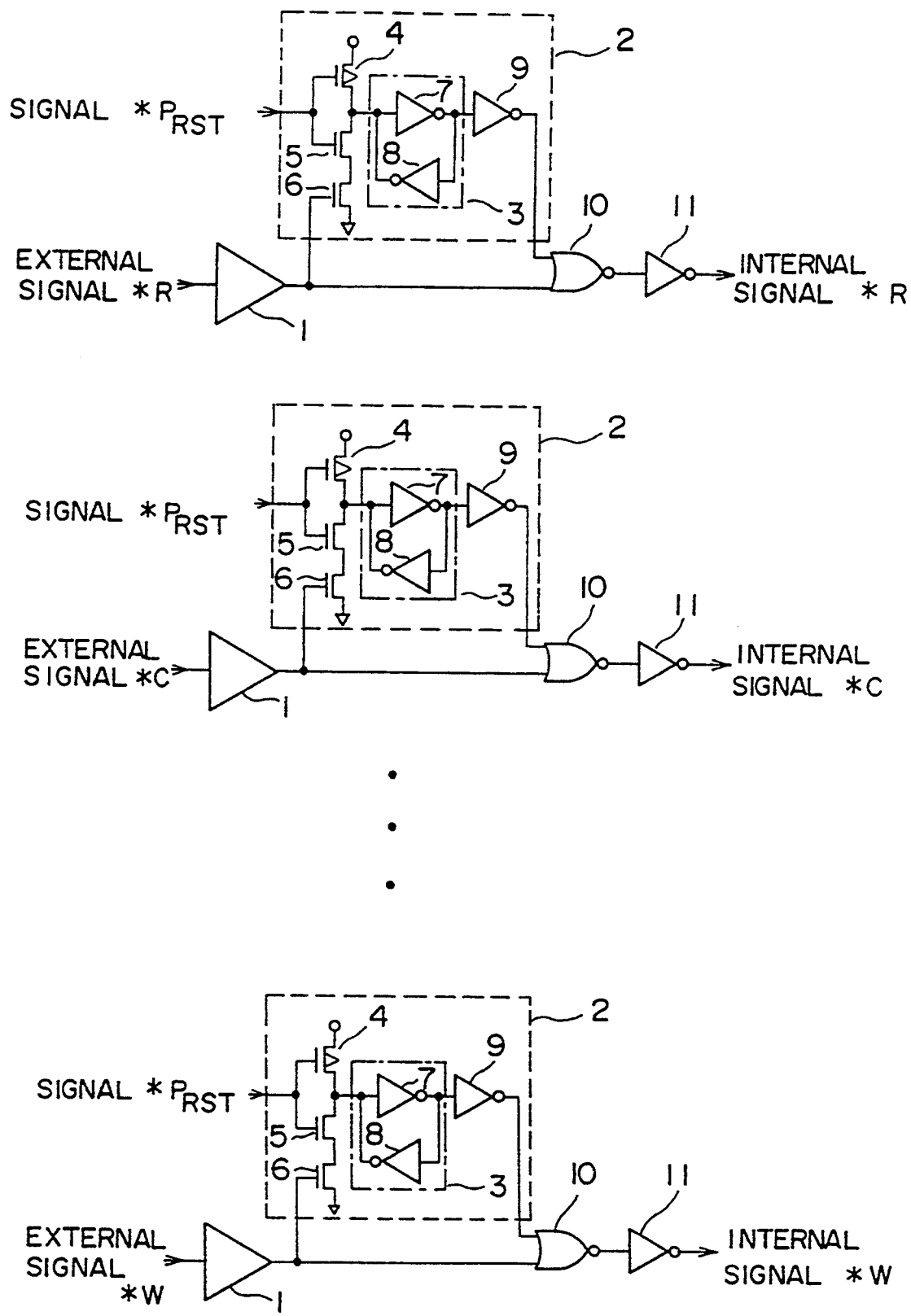
FIG. 12 is a circuit diagram showing a buffer circuit used in a semiconductor device according to a sixth embodiment of the present invention.

Next, there is descried a semiconductor device according to a sixth embodiment with reference to FIG. 12 which shows a circuitry of the sixth embodiment using the circuitry of the first embodiment. External signals *R, *W ...., *O are used in the circuit. For example, when the circuit is used in the DRAM, the signal *R is used as the signal *RAS (a row address strobe), *W as the signal *WE (a write enable) and *O as *OE (an output enable), and if it is necessary, an address terminal is buffering. Even in this sixth embodiment, the description will be performed as an example of the timer circuit 201 as the same as the fifth embodiment, it is needless to say that the sixth embodiment may apply to sense circuit shown in the generating the signal *$P_{RAS}$.

By the constitution shown in FIG. 12, an operation of the first embodiment is performed with respect to an input terminal of the signal for controlling operation of the semiconductor device. Namely, the internal circuits are initialized to the precharge (the internal signal *R is "H") state regardless the external signal state when the power is supplied, and the external signal state is transmitted into the internal circuits after the external signal *R trails to be in the active state after the predetermined time passes through from the power-on time (namely, the signal *$P_{RST}$ is "H"). In such a manner, since the internal circuits can be set to the arbitrary condition regardless of the external signal state at supplying the power, it is possible to easily initialize each of the flip-flops and nodes. As a result, it is possible to prevent an erroneous operation caused by the external signal state when power is supplied. Of course, it is unnecessary to restrict the dummy cycle and the external signal state when the power is supplied as in the conventional device.

Furthermore, it is possible to easily initialize the internal circuits to the arbitrary condition corresponding to each of the external signals, and the circuits which are controlled by external signals at least more than two. It is possible to cancel the initial state when the power is supplied and it is possible to transmit a timing of the state of the external signals into the internal circuits by each external signal by itself.

Figure 15:
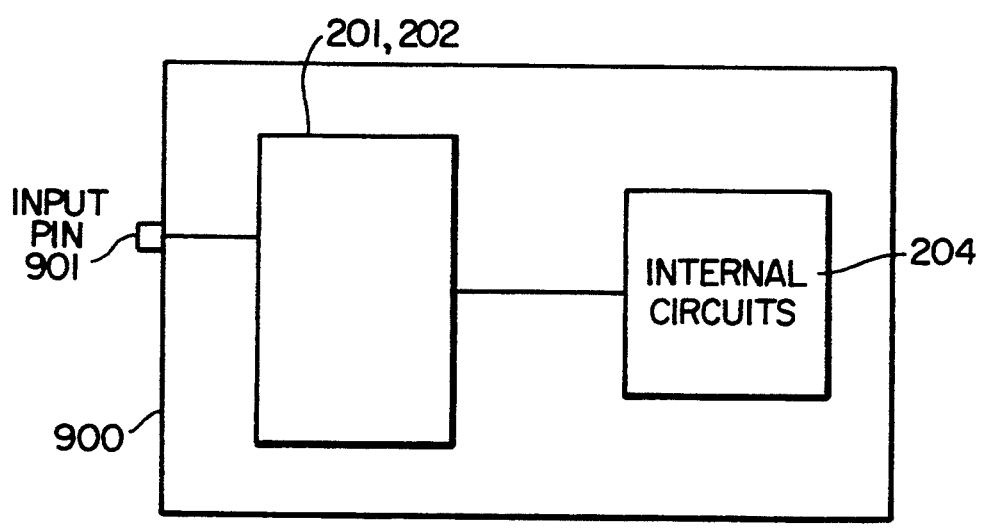
FIG. 15 is a block diagram showing the semiconductor device of FIG. 1 mounted in a package.

FIG. 15 shows a semiconductor device having time circuit 201, buffer circuit 202 and internal circuits 204 mounted in a package 900 with an input pin 901 to interface with an external apparatus As described above, even though the sixth embodiment basically uses the circuitry of the first embodiment, the sixth embodiment may use the circuitries shown in the second through fourth embodiments. Furthermore, when the internal circuit blocks has independence, several circuitries of these embodiments may be used together within the extent that there is no erroneous operation.

What is claimed is:

1. A semiconductor device having a plurality of internal circuits capable of having two conditions of an active state and a precharge state in the internal circuits: comprising timer signal generation means for generating a timer signal which causes said plurality internal circuits to be initialized until satisfying a predetermined condition after a predetermined time passes from a time when a power is supplied; and state set means interconnecting said timer signal generation means and said plurality of internal circuits and which is also connected to an external apparatus through an interface which is supplied by an external state signal, and for outputting an internal state signal corresponding to said external state signal in response to a supply of said timer signal from said signal generation means, thereby setting an operation state for said plurality of internal circuits.

2. The semiconductor device according to claim 1: wherein signal generation means comprises timer signal generation means for generating said timer signal at least after a predetermined time passes through after the power is supplied, and said state set means comprises buffer means which is connected to external apparatus through said interface which inputs said external signal, and provided for outputting a predetermined level regardless of the external signal until the timer signal is supplied and for outputting an internal signal corresponding to said external signal after said timer signal is received.

3. The semiconductor device according to claim 1: wherein said signal generation means comprises timer signal generation means for generating said timer signal at least after a predetermined time passes through after a power is supplied; and said state set means comprises buffer means which is connected to external apparatus through said interface which inputs said external state signal, and provided for outputting a predetermined level regardless of the external signal until said timer signal is supplied and for outputting an internal signal corresponding to the external signal after a detection of a first precharge state or a first active state of said external signal after receiving the timer signal.

4. The semiconductor device according to claim 1: wherein said signal generation means is constituted in a manner of generating said timer signal when a source voltage become over a predetermined voltage; and said state set means comprises buffer means which is connected to external apparatus through said interface which inputs said external state signal, and provided for outputting a predetermined level regardless of the external signal until the timer signal is supplied and for outputting an internal signal corresponding to the external signal after the timer signal is supplied.

5. The semiconductor device according to claim 1: wherein said signal generation means is constituted in a manner of generating said timer signal when a source voltage become over a predetermined voltage; and said state set means comprises buffer means which is connected to external apparatus through said interface which inputs said external state signal, and provided for outputting a predetermined level regardless of the external signal until said timer signal is supplied and for outputting an internal signal corresponding to the external signal after a detection of a first precharge state or a first active state of said external signal after receiving the timer signal.

6. The semiconductor device according to claim 1: wherein said interface is comprised of an input pin which is provided around a package on which said semiconductor device is mounted.

* * * * *